(12) United States Patent
Jackson et al.

(10) Patent No.: US 6,356,597 B1
(45) Date of Patent: Mar. 12, 2002

(54) HIGH PRECISION, LOW PHASE NOISE SYNTHESIZER WITH VECTOR MODULATOR

(75) Inventors: Thomas Jackson, Frederick; David Bourner, Silver Spring; Hai Tang, Columbia, all of MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/625,290

(22) Filed: Jul. 25, 2000

Related U.S. Application Data

(63) Continuation of application No. 08/895,445, filed on Jul. 15, 1997, now Pat. No. 6,122,326, which is a continuation of application No. 08/354,239, filed on Dec. 13, 1994, now abandoned.

(51) Int. Cl.[7] .............................. H04L 27/20; H03C 3/00
(52) U.S. Cl. ....................... 375/308; 375/307; 332/127; 332/145
(58) Field of Search ................................. 375/279, 282, 375/295, 303, 306, 307, 308; 455/76; 327/105; 332/103, 144, 145, 163, 127, 128

(56) References Cited

U.S. PATENT DOCUMENTS 3,644,831 A  *  2/1972 Latker et al. ............... 455/109
3,815,029 A     6/1974 Wilson (List continued on next page.)

FOREIGN PATENT DOCUMENTS

DE           43 20 087 C1    8/1994
EP           0 454 917 A1    6/1991

OTHER PUBLICATIONS

"Quarternary Transmission Over Satellite Channels With Cascaded Nonlinear Elements and Adjacent Channel Interference", Russell J. F. Fang, IEEE, vol. Com–29, No. 5, May 1981, pp. 567–581.

"MSK and Offset QPSK Signal Transmissions Through Nonlinear Satellite Channels in the Presence of Intersymbol Interference", N. Ekanayake, IEEE Proceedings, vol. 130, Part F, No. 6, Oct. 1983, pp. 513–518.

(List continued on next page.)

Primary Examiner—Young T. Tse
(74) Attorney, Agent, or Firm—John T. Whelan; Michael W. Sales

(57) ABSTRACT

An apparatus for generating a modulated signal which includes a modulator operative for receiving a first signal and input data signals, and modulating the first signal in accordance with the input data signals so as to produce a modulated reference signal; a first frequency divider coupled to the modulator output, operative to reduce the frequency of the modulated reference signal by a predetermined factor; a signal generator operative to produce a second signal; a first mixer having a first input coupled to an output of the first frequency divider and a second input coupled to the output of the signal generator. The first mixer operates to frequency translate the modulated reference signal by an amount equal to the frequency of the second signal. In addition, the signal generator of the present invention contains a direct digital synthesizer coupled to a second phase lock loop which operates to up-convert the output signal of the DDS to the microwave region. The feedback network of the second phase lock loop utilizes frequency translation to down-convert the output signal in order to close the loop.

25 Claims, 2 Drawing Sheets

U.S. PATENT DOCUMENTS

| | | | |
|---|---|---|---|
| 3,993,868 A | * 11/1976 | Balcewicz | 375/274 |
| 4,216,542 A | 8/1980 | Hermesmeyer | |
| 4,313,205 A | 1/1982 | Rhodes | |
| 4,324,001 A | 4/1982 | Rhodes | |
| 4,355,404 A | 10/1982 | Uzunoglu | |
| 4,449,250 A | 5/1984 | Kurby | |
| 4,513,447 A | 4/1985 | Carson | |
| 4,751,478 A | * 6/1988 | Yoshida | 332/104 |
| 4,755,774 A | * 7/1988 | Heck | 332/123 |
| 4,930,141 A | 5/1990 | Ohmagari | |
| 5,095,539 A | 3/1992 | Leveque | |
| 5,128,633 A | 7/1992 | Martin et al. | |
| 5,309,479 A | * 5/1994 | Cheah | 375/303 |
| 5,353,311 A | 10/1994 | Hirata et al. | |
| 5,412,351 A | 5/1995 | Nystrom et al. | |
| 5,412,352 A | 5/1995 | Graham | |
| 5,424,688 A | 6/1995 | Phillips | |
| 5,434,887 A | 7/1995 | Osaka | |
| 5,467,373 A | 11/1995 | Ketterling | |
| 5,495,202 A | 2/1996 | Hsu | |
| 5,502,745 A | 3/1996 | Williams et al. | |
| 5,559,475 A | 9/1996 | Fukuyama | |
| 5,721,514 A | * 2/1998 | Crockett et al. | 331/3 |
| 5,819,161 A | * 10/1998 | Saito | 455/86 |
| 5,991,605 A | * 11/1999 | Rapeli | 455/76 |
| 6,008,703 A | * 12/1999 | Perrott et al. | 332/100 |
| 6,026,307 A | * 2/2000 | Blom et al. | 455/553 |
| 6,091,303 A | * 7/2000 | Dent | 331/2 |

OTHER PUBLICATIONS

"Effect of Nonlinear Amplifiers of Transmitters in the CDMA System Using Offset–QPSK", Manabu Sawada, et al, IEICE Trans. Commun., vol. E76–B, No. 7 Jul. 1993, pp. 741–744.

"Experimental Results on Constant Envelope Signaling With Reduced Spectral Sidelobes", Frank Amoroso, International Conference on Communications, Jun. 14–18–1981, pp. 47.1.1–47.1.5.

"Modem Design Using Continuous Phase Modulation With Coding", Carl Ryan, 1985 IEEE Military Communications Conference, Oct. 20–23, 1985, pp. 11.5.1–11.5.6.

"The Effects of Filtering and Limiting A Double–Binary PSK Signal", Robert K. Kwan, IEEE Transactions on Aerospace and Electronic Systems, vol. AES–5, No. 4, Jul. 1969, pp. 589–594.

"VSAT Networks", G. Maral, pp. 27–33.

Amati, M. et al., "Low Noise Agile Microwave Frequency Synthesizer for Satellite Communications" $19^{th}$ European Microwave Conference, Sep. 4–7, 1989, London pp. 561–566.

* cited by examiner

HIGH PRECISION, LOW PHASE NOISE SYNTHESIZER WITH VECTOR MODULATOR

This is a Continuation of application Ser. No. 08/895,445 filed Jul. 15, 1997, now U.S. Pat. No. 6,122,326, which is a Continuation of application Ser. No. 08/354,239 filed Dec. 13, 1994, now abandoned

BACKGROUND OF THE INVENTION

Various systems, such as cellular communication systems, utilize high frequency modulated signals to transmit data between different locations. The use of the high frequency modulated signal allows the data to be transmitted via a wireless link and therefore avoids the costly expense of running cable between the locations.

Typically, in such systems, an intermediate frequency signal is generated by a local oscillator. This first intermediate frequency signal is then up-converted (i.e., frequency multiplied) so as to produce a carrier signal having a frequency suitable for transmission via a wireless link, for example, Ku or C band. The carrier signal is then modulated in accordance with the data to be transmitted. Alternatively, the intermediate frequency signal can be modulated prior to up-converting the signal to the carrier frequency.

The use of the intermediate frequency signal provides numerous advantages. For example, in many communication systems the location of the antenna for transmitting and receiving modulated carrier signals is distant from the components generating and processing the data. By utilizing intermediate frequency signals to transmit data between components contained in the same location, the need for expensive cable, which would be necessary to transmit high frequency carrier signals with acceptable loss and leakage levels, is eliminated. Accordingly, wireless communication systems typically up-convert the intermediate frequency signal to the carrier frequency as one of the last steps in generating the modulated carrier signal.

A problem remains in that prior art systems typically utilize conventional phase lock loops ("PLL") to up-convert the intermediate frequency signal. The use of such PLLs, while raising the frequency as required, also results in a substantial increase in the phase noise and thus the phase sitter associated with the signal. The increase in phase noise degrades the spectral purity (i.e., increases the noise floor) of the signal, which is undesirable.

Another problem with prior art systems pertains to the frequency deviation characteristics of the modulator (i.e., the frequency error or frequency variance generated by the modulator) utilized to superimpose the data to be transmitted on the intermediate frequency signal prior to the up-conversion process. Frequency deviation relates to the amount the output of the modulator deviates from the desired frequency. As such, it is desirable to minimize the frequency deviation as much as possible.

In prior art systems which modulate the intermediate frequency signal and then up-convert the signal to the carrier frequency, the frequency deviation or error is also multiplied by the same factor as the frequency, which can be on the order of 100 or greater. Specifically, the frequency error increases in accordance with ratio between the carrier and the intermediate frequency. As a result, the frequency of the modulated carrier signal is susceptible to undesirable variations.

Accordingly, there exists a need for an apparatus for generating a modulated carrier signal suitable for transmission via a wireless link which negates the foregoing problems.

SUMMARY OF THE INVENTION

The present invention relates to an apparatus for producing a low phase noise, high precision, modulated signal. Specifically, the invention comprises a novel synthesizer/modulator design which allows for the modulation and frequency multiplication of an intermediate frequency signal without a corresponding increase in the frequency deviation or phase noise of the signal.

Accordingly, the present invention relates to an apparatus for generating a modulated signal comprising a modulator operative for receiving a first signal and input data signals, and modulating the first signal in accordance with the input data signals so as to produce a modulated reference signal; a first frequency divider coupled to the modulator output, operative to reduce the frequency of the modulated reference signal by a predetermined factor; a signal generator operative to produce a second signal; a first mixer having a first input coupled to an output of the first frequency divider and a second input coupled to the output of the signal generator. The first mixer operates to frequency translate the modulated reference signal by an amount equal to the frequency of the second signal.

In addition, the signal generator of the present invention comprises a direct digital synthesizer ("DDS") coupled to a phase lock loop which operates to up-convert the output signal of the DDS to the microwave region. The feedback network of the second phase lock loop utilizes frequency translation to down-convert the signal in order to close the loop.

As described in detail below, the apparatus of the present invention provides important advantages. For example, by down-converting the modulated reference signal output by the modulator, the frequency deviation of the modulated reference signal is also reduced by the same factor. Accordingly, inexpensive modulators operating in the microwave region can be utilized. Without such down-conversion, upon completing the up-conversion process, the frequency deviation of the modulated reference signal would exceed the frequency deviation rating of the modulator.

Furthermore, the down-conversion of the modulated reference signal also provides the added benefit that any error in the I/Q balance of the input data signals to the modulator is also reduced by the same factor.

In addition, by utilizing frequency translation in the feedback loop of the phase lock loop contained in the signal generator, the present invention increases the frequency of the output signal of the DDS without increasing the phase noise or spurious frequency components of the signal.

The invention itself, together with further objects and attendant advantages, will best be understood by reference to the following detailed description, taken in conjunction with the accompanying drawings.

DETAILED DESCRIPTION OF THE DRAWINGS

Figure 1:
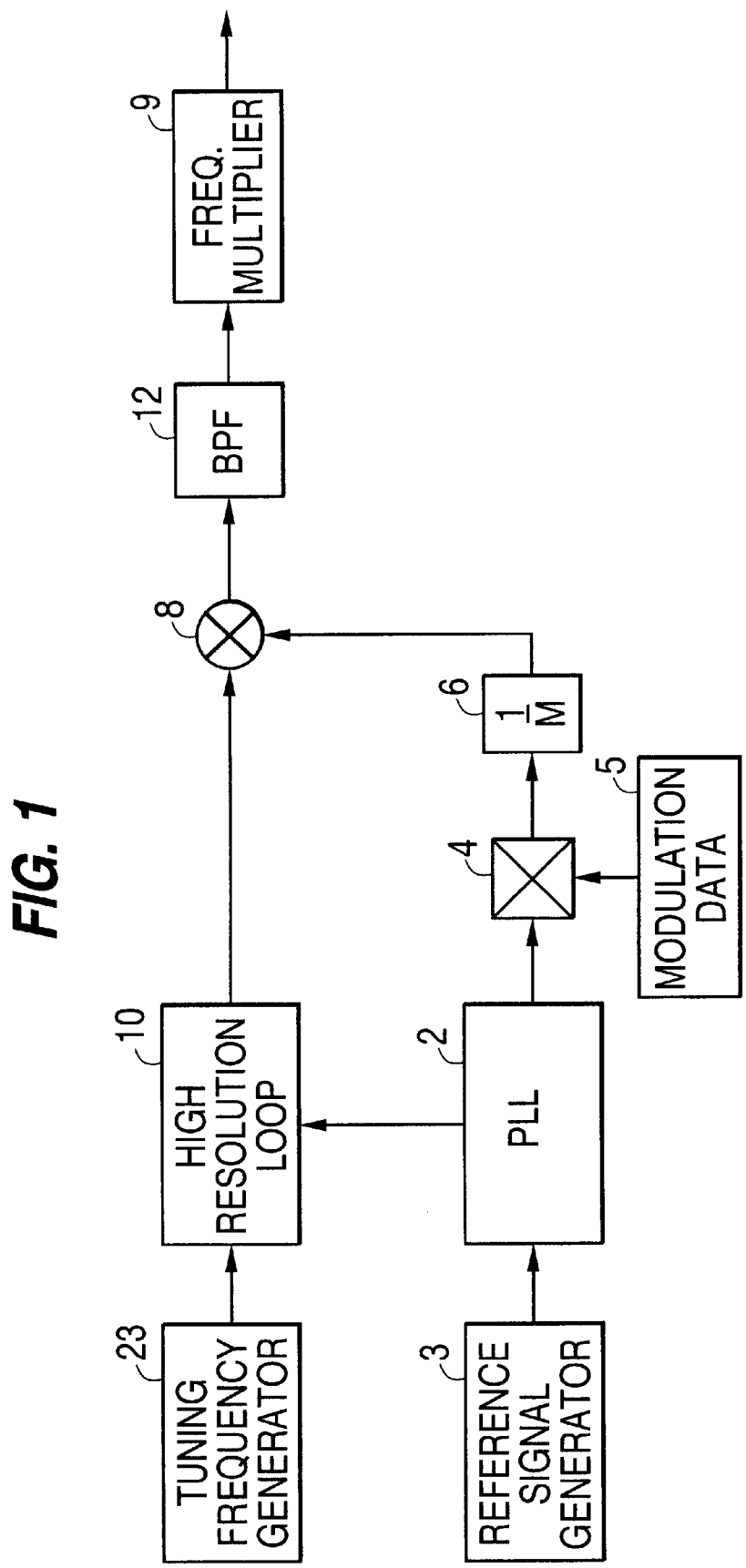
FIG. 1 is a block diagram of the synthesizer/modulator of the present invention.

Referring to FIG. 1, the synthesizer/modulator of the is present invention comprises a first phase lock loop 2 having an input port for receiving a reference signal 3 from a local oscillator, or equivalent thereof, and an output port which is coupled to an input port of a modulator 4. The first PLL 2 functions to frequency multiply the reference signal 3 to a to predetermined frequency.

The modulator 4, for example, a quadrature or phase modulator, receives modulation data 5 to be superimposed on the up-converted reference signal generated by the first PLL 2. The modulated reference signal generated by the modulator 4 exhibits full scale frequency deviation in accordance with the frequency deviation rating of the modulator 4.

It is noted that the modulation data 5 represents the information to be transmitted. The type of modulation data 5 input to the modulator 4 varies in accordance with the modulation scheme being utilized. For example, if the modulation scheme utilized is quadrature phase shift keying "QPSK," the modulator 4 would be a QPSK modulator and the modulation data 5 input into the modulator 4 could be a serial data stream.

The modulated reference signal is coupled to a frequency divider 6, which down-converts the modulated reference signal by a predetermined factor M. However, along with the reduction in frequency, the frequency divider 6 reduces the frequency deviation of the modulated reference signal by a factor of M. The output of the frequency divider 6 is coupled to one input of a mixer 8.

As explained in greater detail below, the other input to the mixer 8 is coupled to the output of a high resolution tunable signal generator 10 comprising a DDS 22 and a second PLL 26 which utilizes frequency translation in the feedback loop (neither the DDS 22 nor the PLL 26 is shown in FIG. 1). The tunable signal generator 10 is desirable so as to allow for various techniques, such as, frequency division multiple access ("FDMA") which is utilized in cellular systems.

The output of the mixer 8 is coupled to a bandpass filter 12 so as to select either the upper or lower sideband of the resultant signal. As a result, the signal present at the output of the baseband filter 12 exhibits low phase and a frequency deviation which is less than frequency deviation of the modulator 4. A frequency multiplier 9 can be utilized to frequency multiply the intermediate frequency signal output by the mixer 8.

Further, the first PLL 2 provides a reference signal 25 which is coupled to the DDS 22 of the signal generator 10 via a frequency/divider 24. As explained below, the reference signal 25 functions as a stable local oscillator as required by the operation of the DDS 22.

The first PLL 2 also provides an input 27 to a mixer 36 contained in the feedback loop of the second PLL 26. As explained below, the mixer 36 functions to frequency translate the output signal of the second PLL 26 to a lower frequency in order to close the feedback loop of the second PLL 26. It is this frequency translation which prevents an increase in the phase noise of the signal generated by the second PLL 26.

Advantageously, the present invention allows for the use the use of inexpensive modulators 4, for example, the ATT W2010 I/Q modulator, which produces a modulated signal having both amplitude and phase modulation. As explained above, the frequency deviation of the modulated signal is reduced by frequency dividing the modulated signal prior to up-converting the signal to the carrier frequency. If the factor by which the modulated signal is reduced is greater than the factor by which the modulated signal is subsequently increased to produce the carrier signal, the frequency deviation of the modulated carrier signal will remain less than the full scale deviation of the modulator 4.

Accordingly, the design of the synthesizer/modulator of the present invention utilizes two feedback loops to generate the low phase noise, high precision, modulated signal. The first loop comprises the high resolution tunable signal generator 10, which utilizes the DDS 22 to precisely set the frequency of the signal to be transmitted, and a second PLL 26 utilizing frequency translation, which raises the frequency of the signal generated by the DDS 22 without raising the phase noise or the spurious frequency components of the signal output by the DDS 22.

The second loop comprises the first PLL 2, the phase modulator 4 and the frequency divider 6, and functions to produce a modulated signal having a frequency deviation which is less than the frequency deviation of the phase modulator 4.

The operation of the present invention is explained in further detail in conjunction with the operation of a satellite communication system comprising a plurality of remote ground terminals which communicate with a central hub station via a satellite. Typically, the remote ground terminals comprise a small aperture directional antenna for receiving and transmitting signals to the satellite, an indoor unit for generating a modulated data signal and for demodulating incoming signals and an outdoor unit mounted proximate the antenna for converting the modulated data signal into a modulated carrier signal. The present invention would be utilized to generate the modulated data signal in such a system.

Figure 2:
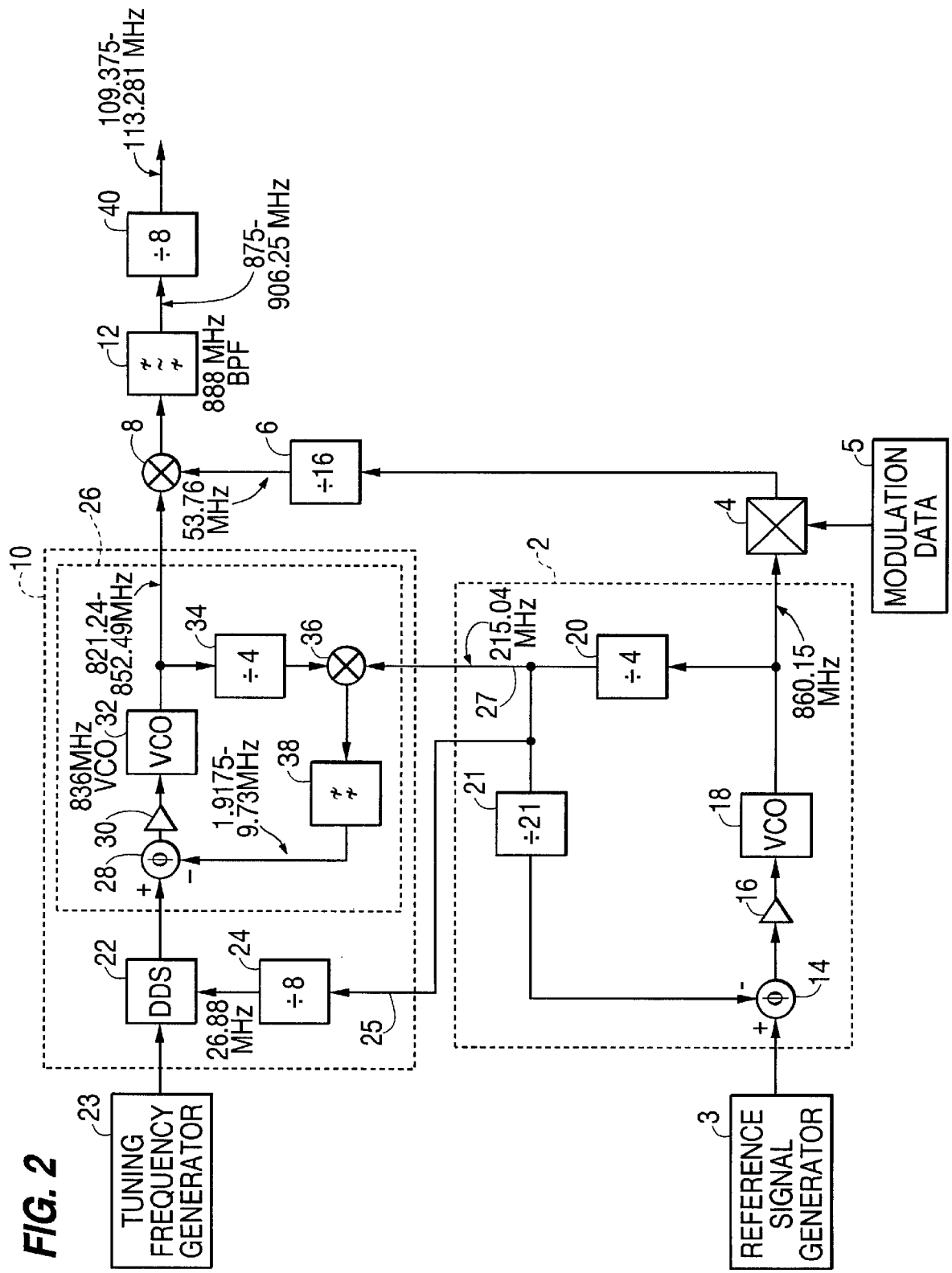
FIG. 2 is a schematic diagram of one embodiment of the apparatus of FIG. 1.

Referring to FIG. 2, the first PLL 2 is a standard phase lock loop comprising a phase detector 14 having one input for receiving a 10.24 MHz reference signal, which is generated, for example, by a local oscillator, a low pass filter 16 coupled to the output of the phase detector 14, a voltage controlled oscillator ("VCO") 18 coupled to the output of the low pass filter 16, a first frequency divider 20 coupled to the output of the VCO 18, and a second frequency divider 21 coupled to the output of the first frequency divider 20. The output of the second frequency divider 21 is coupled to a second input of the phase detector 14 so as to complete the feedback network of the first PLL 2.

As shown in FIG. 2, the first frequency divider 20 divides the output of the VCO 18 by a factor of 4 to produce a 215.04 MHz reference signal, and the second frequency divider 21 divides this signal by a factor of 21 so as to produce a reference signal having a frequency of 10.24 MHz.

As stated above, the output of the first PLL 2, which is a 860.16 MHz reference signal taken at the output of the VCO 18, is coupled to the input of the modulator 4. The modulator 4 receives modulation data 5 and produces a phase modulated signal having a constant amplitude. Acceptable modulation schemes include minimum shift keying ("MSK") modulation. The phase modulated signal output by the modulator 4 also exhibits full scale frequency deviation (i.e., the maximum frequency deviation as rated by the modulator specification).

The output of the modulator 4 is coupled to the frequency divider 6 which reduces the frequency of the modulated signal and the frequency deviation by a factor of 16 to produce a modulated reference signal having a frequency of 53.76 MHz, The output of the frequency divider 6 is coupled to one input of a mixer 8. The other input to the mixer 8 is provided by the output of the high resolution tunable signal generator 10.

The high resolution tunable signal generator 10 comprises a DDS 22, for example, the HSP45102 produced by Harris Corp., having a first input for receiving a variable frequency signal 23 (i.e., tuning frequency) utilized to tune the output of the DDS 22 to the desired frequency, and a second input for receiving a reference signal 25. The reference signal 25 is generated by coupling the output of the first frequency divider 20 of the first PLL 2 to a frequency divider 24 which divides the signal by a factor of 8. The output of the frequency divider 24, which is a 26.88 MHz reference signal, is coupled to the second input of the DDS 22. The output of the DDS 22, which is coupled to the input of the second PLL 26, is tunable in accordance with the variable frequency signal 23 and in the present embodiment is approximately 6 MHz.

The second PLL 26 comprises a phase detector 28 having one input for receiving the output signal from the DDS 22, a low pass filter 30 coupled to the output of the phase detector 28, a VCO 32 coupled to the output of the low pass filter 30, a frequency divider 34 coupled to the output of the VCO 32, a mixer 36 having one input port coupled to the output of the frequency divider 34, and a bandpass filter 38 coupled to the output of the mixer 36. The output of the bandpass filter 38 is coupled to a second input of the phase detector 28 so as to complete the second PLL 26. The second input port of the mixer 36 is coupled to the output of the first frequency divider 20 of the first PLL 2.

The operation of the high resolution tunable signal generator 10 is as follows. As stated, in the present embodiment, the output of the DDS 22 is tuned so as to generate a reference frequency of 6 MHz. The VCO 32 generates a signal having a nominal frequency of 836 MHz which is divided by a factor of 4 by the frequency divider 34. The resulting 209 MHz signal is then coupled to the mixer 36, which in conjunction with the 215.04 MHz signal input from the first PLL 2, frequency translates the 209 MHz signal to a nominal 6 MHz signal. This 6 MHz signal is then compared to the DDS 22 output signal in the phase detector 28 to close the loop.

By utilizing the frequency translation scheme in the feedback loop, a precisely tunable frequency reference is established that exhibits phase noise characteristics significantly less than that of a synthesizer utilizing a conventional phase lock loop. Furthermore, the use of the frequency translation scheme minimizes the increase in the spurious frequency components generated by the DDS 22.

The output of the high resolution tunable signal generator 10 is coupled to the other input of mixer 8, which functions to produce a nominal 890 MHz modulated intermediate frequency signal having minimal phase noise and 1/16 the frequency deviation produced by the modulator 4.

The modulated intermediate frequency signal output by the mixer 8 is coupled to an additional frequency divider 40 via bandpass filter 12. The frequency divider 40 further reduces the frequency of the signal and the frequency deviation by a factor of 8. The resulting signal having a nominal frequency of 111 MHz is then coupled to an outdoor unit located proximate an antenna. The outdoor unit up-converts the modulated signal to the desired carrier frequency utilizing direct multipliers, such as gallium arsenide FETs. The modulated carrier signal is then coupled to an antenna and transmitted.

The apparatus of the present invention provides numerous advantages. For example, by down-converting the modulated reference signal output by the modulator, the frequency deviation of the modulated reference signal is also reduced by the same factor. As such, inexpensive modulators operating in the microwave region can be utilized.

Another advantage obtained by the down-conversion of the modulated reference signal is that any error in the I/Q balance of the input data signals to the modulator is also reduced by the same factor.

Yet another advantage is that the present invention increases the frequency of the output signal of the DDS without increasing the phase noise or spurious frequency components of the DDS signal. As stated above, this is accomplished by utilizing frequency translation in the feedback loop of the phase lock loop contained in the signal generator.

Numerous variations of the foregoing invention are also possible. For example, the operational frequencies described above relate to the generation of a modulated signal having a nominal frequency of 111 MHz, the foregoing invention can be utilized to generate modulated signals having any desired frequency.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. An apparatus for generating a phase-modulated signal, the apparatus comprising:
    a quadrature modulator for phase and amplitude modulating a reference signal with an input information signal so as to produce a phase and amplitude modulated signal;
    a first frequency divider circuit coupled to the output of the quadrature modulator, the first frequency divider circuit operative for reducing the frequency and frequency deviation of the phase and amplitude modulated signal, said first frequency divider circuit outputting the phase-modulated signal having an envelope wherein the amplitude of the phase-modulated signal is fixed; and
    a mixer coupled to the first frequency divider, the mixer operative for frequency translating the phase-modulated signal in accordance with a second reference signal coupled to the mixer.

2. The apparatus of claim 1, further comprising a band-pass filter coupled to the mixer.

3. The apparatus of claim 1, further comprising a second frequency divider circuit coupled to the band-pass filter.

4. The apparatus of claim 1, further comprising:
    a local oscillator for generating a local oscillator signal;
    a phase lock loop for frequency multiplying the local oscillator signal, the phase lock loop providing the reference signal to the quadrature modulator.

5. An apparatus for generating a phase-modulated signal, the apparatus comprising:
    an I/Q modulator for phase and amplitude modulating a reference signal with an input information signal so as to produce a phase and amplitude modulated signal;
    a first frequency divider circuit coupled to the output of the I/Q modulator, the first frequency divider circuit operative for reducing the frequency and frequency deviation of the phase and amplitude modulated signal, said first frequency divider circuit outputting the phase-modulated signal having an envelope wherein the amplitude of the phase-modulated signal is fixed; and
    a mixer coupled to the first frequency divider, the mixer operative for frequency translating the phase-modulated signal in accordance with a second reference signal coupled to the mixer.

6. The apparatus of claim 5, further comprising a band-pass filter coupled to the mixer.

7. The apparatus of claim 6, further comprising a second frequency divider circuit coupled to the band-pass filter.

8. The apparatus of claim 5, further comprising:
   a local oscillator for generating a local oscillator signal;
   a phase lock loop for frequency multiplying the local oscillator signal, the phase lock loop providing said reference signal to the I/Q modulator.

9. An apparatus for generating a phase-modulated signal, the apparatus comprising:
   a quadrature modulator for phase and amplitude modulating a reference signal with an input information signal so as to produce a phase and amplitude modulated signal;
   a frequency divider circuit coupled to the output of the quadrature modulator, the frequency divider circuit operative for reducing the frequency and frequency deviation of the phase and amplitude modulated signal, said frequency divider circuit outputting the phase-modulated signal having an envelope wherein the amplitude of the phase-modulated signal is fixed;
   a mixer coupled to the frequency divider circuit, the mixer operative for frequency translating the phase-modulated signal in accordance with a second reference signal coupled to the mixer and outputting a modulated data signal; and
   a multiplier circuit for frequency multiplying said modulated data signal by a predetermined factor.

10. The apparatus of claim 9, wherein the phase and amplitude modulated signal is frequency divided, the phase-modulated signal is then frequency translated and the modulated data signal is then frequency multiplied without an increase in frequency deviation or phase noise.

11. An apparatus for generating a phase-modulated signal, the apparatus comprising:
    an I/Q modulator for phase and amplitude modulating a reference signal with an input information signal so as to produce a phase and amplitude modulated signal;
    a first frequency divider circuit coupled to the output of the I/Q modulator, the first frequency divider circuit operative for reducing the frequency and frequency deviation of the phase and amplitude modulated signal, said first frequency divider circuit outputting the phase-modulated signal having an envelope wherein the amplitude of the phase-modulated signal is fixed;
    a mixer coupled to the first frequency divider circuit, the mixer operative for frequency translating the phase-modulated signal in accordance with a second reference signal coupled to the mixer and outputting a modulated data signal; and
    a multiplier circuit for frequency multiplying said modulated data signal by a predetermined factor.

12. The apparatus of claim 11, further comprising a band-pass filter coupled to the mixer.

13. The apparatus of claim 12, further comprising a second frequency divider circuit coupled to the band-pass filter.

14. The apparatus of claim 11, wherein the phase and amplitude modulated signal is frequency divided, the phase-modulated signal is then frequency translated and the modulated data signal is then frequency multiplied without an increase in frequency deviation or phase noise.

15. An apparatus for generating a low-phase-noise, low-spurious-frequency phase-modulated signal, the apparatus comprising:
    a local oscillator for generating a reference signal;
    a first phase lock loop for frequency multiplying the reference signal by a first predetermined factor to generate a first signal of higher frequency than the reference signal;
    a quadrature modulator for phase and amplitude modulating the first signal in accordance with input I/Q data signals to produce a phase and amplitude modulated signal;
    a first frequency divider circuit coupled to an output of the quadrature modulator for reducing the frequency and frequency deviation of the phase and amplitude modulated signal by a second predetermined factor, said first frequency divider circuit outputting the phase-modulated signal having an envelope wherein the amplitude of the phase-modulated signal is fixed;
    a signal generator for generating a second signal;
    a first mixer for frequency translating the phase-modulated signal according to the frequency of the second signal; and
    a multiplier circuit for frequency multiplying said frequency translated phase-modulated signal by a third predetermined factor.

16. The apparatus of claim 15, wherein said signal generator comprises:
    a direct digital synthesizer for generating a tunable signal, said synthesizer having a first input and second input, said first input operative to receive a tuning frequency signal, said second input operative to receive a first reference signal; and
    a second phase lock loop for multiplying the frequency of said tunable signal by a predetermined amount so as to generate said second signal.

17. The apparatus of claim 16, wherein said second phase lock loop comprises a feedback network including a second mixer having a first input coupled to an output of said second phase lock loop and a second input coupled to a second reference signal, and wherein said second mixer is operative to frequency translate said second signal by an amount equal to the frequency of said second reference signal.

18. The apparatus of claim 17, wherein said second input of said second mixer is coupled to an output of a second frequency divider circuit within said first phase lock loop.

19. The apparatus of claim 15, wherein the phase and amplitude modulated signal is frequency divided, the phase-modulated signal is then frequency translated and the phase-modulated signal is then frequency multiplied without an increase in frequency deviation or phase noise.

20. An apparatus for generating a low-phase-noise, low-spurious-frequency phase-modulated signal, the apparatus comprising:
    a local oscillator for generating a reference signal;
    a first phase lock loop for frequency multiplying the reference signal by a first predetermined factor to generate a first signal of higher frequency than the reference signal;
    a quadrature modulator for modulating the first signal in accordance with input data signals to produce a phase and amplitude modulated signal;
    a frequency divider circuit coupled to an output of the quadrature modulator for reducing the frequency and frequency deviation of the phase and amplitude modulated signal by a second predetermined factor, said frequency divider circuit outputting the phase-modulated signal having an envelope wherein the amplitude of the phase-modulated signal is fixed;

a signal generator for generating a second signal;

a mixer for frequency translating the phase-modulated signal according to the frequency of the second signal; and a multiplier circuit for frequency multiplying said frequency translated phase-modulated signal by a third predetermined factor.

21. The apparatus of claim 20, wherein the phase and amplitude modulated signal is frequency divided, the phase-modulated signal is then frequency translated and the phase-modulated signal is then frequency multiplied without an increase in frequency deviation or phase noise.

22. A method for generating a frequency-divided phase-modulated signal, the method comprising the steps of:

phase and amplitude modulating a reference signal with an input information signal utilizing a quadrature modulator to produce a phase and amplitude modulated signal;

frequency dividing said phase and amplitude modulated signal to reduce the frequency and frequency deviation of the phase and amplitude modulated signal, and to produce the frequency-divided phase-modulated signal having an envelope wherein the amplitude of the frequency-divided phase-modulated signal is fixed;

mixing the frequency-divided phase-modulated signal to frequency translate the frequency divided phase-modulated signal in accordance with a second reference signal and output a modulated data signal; and frequency multiplying said modulated data signal by a predetermined factor.

23. The method of claim 22, wherein the phase and amplitude modulated signal is frequency divided, the frequency divided phase-modulated signal is then frequency translated and the modulated data signal is then frequency multiplied without an increase in frequency deviation or phase noise.

24. A method for generating a frequency-divided phase-modulated signal having low phase noise and low spurious level characteristics, the method comprising the steps of:

generating a reference signal and input I/Q data signals;

frequency multiplying the reference signal by a predetermined amount by means of a first phase lock loop to generate a first signal;

phase and amplitude modulating the first signal in accordance with said input I/Q data signals utilizing a quadrature modulator to produce a phase and amplitude modulated signal;

frequency dividing said phase and amplitude modulated signal to reduce the frequency and frequency deviation of the phase and amplitude modulated signal by a first predetermined factor to thereby develop the frequency-divided phase-modulated signal having an envelope wherein the amplitude of the frequency-divided phase-modulated signal is fixed;

generating a second signal by means of a signal generator;

mixing the frequency-divided phase-modulated signal and the second signal to frequency translate the frequency-divided phase-modulated signal according to the frequency of the second signal; and frequency multiplying said frequency-divided phase-modulated signal by a second predetermined factor.

25. The method of claim 24, wherein said phase and amplitude modulated signal is frequency divided, the frequency-divided phase-modulated signal is then frequency translated and the frequency-divided phase-modulated signal is then frequency multiplied without an increase in frequency deviation or phase noise.

* * * * *